March 7, 1950

M. J. PIFER 2,499,875

MOTOR TUNING STOPPING CIRCUIT

Filed July 18, 1945

INVENTOR
Marion J. Pifer
BY C. A. Norton
ATTORNEY

Patented Mar. 7, 1950

2,499,875

UNITED STATES PATENT OFFICE 2,499,875

MOTOR TUNING STOPPING CIRCUIT

Marion J. Pifer, Williamsville, N. Y., assignor to Colonial Radio Corporation, Buffalo, N. Y.

Application July 18, 1945, Serial No. 605,809

4 Claims. (Cl. 250—40)

Figures 1, 2:
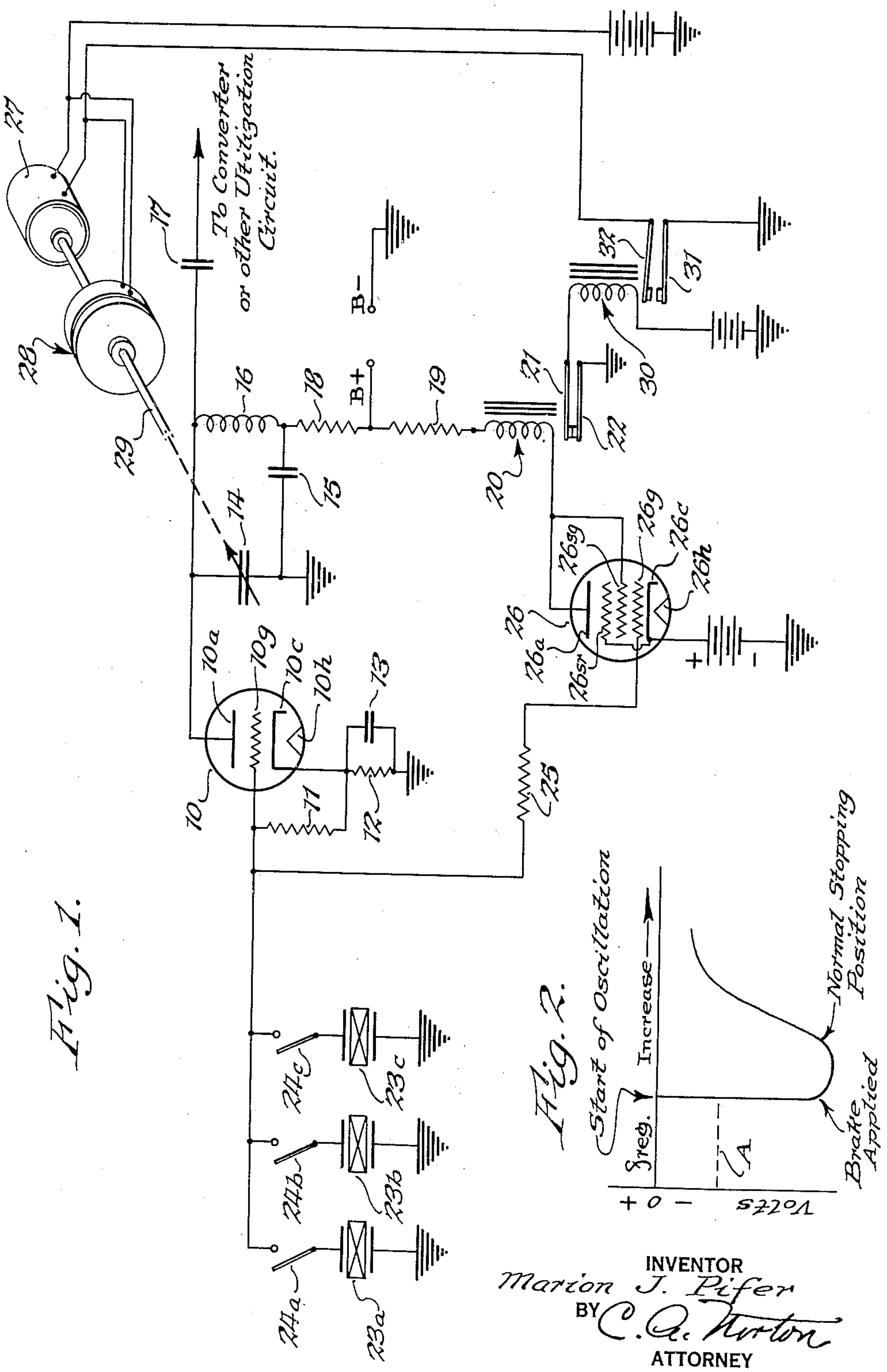

This invention relates to motor tuning stopping circuits, and more particularly to circuits wherein a variable tuning element or tuning instrumentality is operated by a motor and is stopped automatically when the circuit to be tuned comes into resonance. Such circuits are particularly useful in automatic tuning of radio receivers and transmitters, although it will be understood that they are not limited thereto and may be employed in many other applications. Various forms of such circuits are described in the co-pending application of William S. Winfield, Serial No. 463,775, filed October 29, 1942.

In the usual form of resonant circuit the resonance curve is symmetrical about its axis, and this may introduce some difficulties in reliability of operation. In accordance with this invention, I eliminate or greatly reduce such difficulties by making use of apparatus having a resonance curve which is not symmetrical about its axis, but which, on the contrary, is extremely sharp, and practically straight sided on one side, and not nearly as sharp on the other side, and I arrange the circuit so that in approaching the resonant frequency it is always approached toward the sharp side. This provides a number of advantages in obtaining reliability and constancy of the tuning frequency in repeated tunings.

It is an object of this invention to provide an automatic tuning circuit in which the reliability and constancy of the stopping frequencies is greatly increased over the apparatus heretofore known.

It is a further object of this invention to provide such a circuit employing a plurality of crystals for determining the stopping frequencies.

It is a further object of this invention to employ control circuits having a non-symmetrical resonance curve.

It is a further object of this invention to provide such apparatus having a resonance curve which is extremely steep or sharp on one side and in which the tuning always approaches the point of resonance on the sharp or steep side of the curve.

Still other objects and advantages of my invention will be apparent from the specification.

The features of novelty which I believe to be characteristic of my invention are set forth with particularity in the appended claims. My invention itself, however, both as to its fundamental principles and as to its particular embodiments, will best be understood by reference to the specification and accompanying drawing, in which Fig. 1 is a circuit diagram of so much of the apparatus in accordance with my invention as is necessary to an understanding of the operation thereof, and Fig. 2 is a curve illustrating the operation of my invention.

Referring now more particularly to Fig. 1, I prefer to employ an oscillating circuit including oscillator tube 10. This may have any number of forms, but for simplicity I have illustrated tube 10 as a triode having cathode 10*c*, heater 10*h*, control electrode 10*g*, and anode 10*a*. The anode circuit may include a resonant circuit made up of variable condenser 14, fixed condenser 15, and inductance 16.

The voltage developed in the oscillating circuit may be supplied through condenser 17 to any suitable utilization circuit; for instance, the converter of a superheterodyne receiver or the power amplifier of a transmitter. The common point of condensers 14 and 15 may be grounded and the common point of condenser 15 and inductance 16 connected through resistance 18 to the positive terminal of the B voltage supply, the negative terminal of which may be grounded.

Cathode 10*c* may be connected to ground through resistance 12 shunted by condenser 13, and control electrode 10*g* may be connected through resistance 11 to cathode 10*c*. Variation of tuning may be obtained by operation of variable condenser 14, which may be one section of a gang tuning condenser in case other circuits are tuned therewith, or other tuning instrumentalities, such as variometers may be employed.

Tuning instrumentality 14 may be driven by any suitable motor 27 through clutch and brake mechanism 28, to which tuning instrumentality shaft 29 may be connected. The motor circuit, and likewise the clutch and brake mechanism, may be controlled by the action of tube 26, herein shown as a pentode comprising cathode 26*c*, heater 26*h*, control electrode 26*g*, screen electrode 26*sg*, suppressor electrode 26*sr* preferably connected within the tube to cathode 26*c*, and anode 26*a*.

The anode may be connected through control relay coil 20 and resistance 19 to the B+ supply. Control electrode 26*g* may be connected through resistance 25 to control electrode 10*g* of oscillator tube 10. Screen electrode 26*sg* may be connected to anode 26*a*, and cathode 26*c* may be connected through a suitable source of biasing voltage to ground. Control of the oscillator frequency may be exercised through crystals 23a, 23b, 23c, etc., selectively connectable between control electrode 10g and ground by selector switches 24a, 24b, 24c, etc. These switches are preferably of the latch-in push button type, so that only one may be closed at a time, and remains closed until another is pressed.

Control relay 20 preferably does not operate directly in the motor circuit, but controls a second relay 30, which may be connected in series with relay contacts 21 and 22, a source of operating voltage and ground, and the coil of relay 30 may control relay contacts 31 and 32 in the motor circuit. The motor circuit may be connected through a suitable source of operating power to ground.

Fixed contact 22 of relay 20 may be connected to ground, whereby when armature 21 is in contact therewith, relay 30 is energized and the motor circuit is opened, the clutch disengaged, and the brake applied. This will only occur when tube 10 is oscillating and has reached the point on the curve of Fig. 2 indicated by "Brake applied." A certain amount of coasting will take place between this point and the point at which the tuning instrumentality shaft stops rotating, indicated on Fig. 2 by the legend, "Normal stopping position."

Whenever tube 10 has its plate circuit tuned to a frequency different from that of the crystal connected to the grid, no oscillations will occur, no voltage will be applied by oscillator 10 to tube 26, its grid voltage will be insufficient to stop the flow of plate current, and relay 20 will be energized, opening contact 21 from contact 22 and thereby permitting contact 32 to close against contact 31, energizing the motor circuit, releasing the brake, and clutching the motor to shaft 29.

The tuning will continue to vary in a direction to increase the frequency until it comes into resonance, at which point the voltage applied to the grid of tube 26 increases sharply in accordance with Fig. 2 and the space current of tube 26 is reduced or cut off, permitting closure of contact 21 against contact 22, thereby opening the motor circuit by separation of contact 32 from contact 31.

In operation, therefore, in order to change the tuning from one frequency to another, all that the operator has to do is to close the desired switch, as 24a, 24b, or 24c thereby releasing the switch previously closed. Since the frequency of each of the control crystals will usually be different, oscillator tube 10 will no longer be in resonance, and the tuning motor will be energized and will re-tune the oscillator until it reaches resonance with the newly selected frequency, at which time the tuning motor will be stopped through the action already described, and the apparatus will operate on the newly operated frequency until another switch of the above identified group is closed.

It may be noted that in the practice of this invention it is desirable to keep the plate circuit inductive and, therefore, it must be tuned slightly higher in frequency than the crystal. However, as will be understood, although the tuned circuit is tuned slightly higher in frequency than the crystal, the frequency of oscillations generated will be that of the crystal.

In the specification I have explained the principles of my invention and the best mode in which I have contemplated applying those principles, so as to distinguish my invention from other inventions; and I have particularly pointed out and distinctly claimed the part, improvement, or combination which I claim as my invention or discovery.

While I have shown and described certain preferred embodiments of my invention, it will be understood that modifications and changes may be made without departing from the spirit and scope thereof, as will be clear to those skilled in the art.

I claim:

1. In automatic tuning apparatus, in combination, an oscillator including a frequency-determining element and a resonant circuit having an adjustable tuning instrumentality, said element causing said oscillator to have an amplitude of oscillation which at a preselected frequency established by said element rises abruptly to a maximum value and then gradually decreases as said tuning instrumentality is adjusted continuously in a given sense over a range of adjustment thereof, power-energizable means for adjusting said tuning instrumentality through said preselected frequency and in said given sense over said range, and a control system responsive to a predetermined amplitude of oscillation of said oscillator for deenergizing said last-mentioned means to terminate said adjustment of said tuning instrumentality thereby.

2. In automatic tuning apparatus, in combination, an oscillator comprising a vacuum tube having an input circuit including a piezoelectric crystal and a resonant output circuit having an adjustable tuning instrumentality, said crystal causing said oscillator to have an amplitude of oscillation which at a preselected frequency established by said crystal rises abruptly to a maximum value and then gradually decreases as said tuning instrumentality is adjusted continuously in a given sense over a range of adjustment thereof, power-energizable means for adjusting said tuning instrumentality through said preselected frequency and in said given sense over said range, and a control system responsive to a predetermined amplitude of oscillation of said oscillator for deenergizing said last-mentioned means to terminate said adjustment of said tuning instrumentality thereby.

3. In automatic tuning apparatus, in combination, an oscillator including a plurality of selectable frequency-determining elements and a resonant circuit having an adjustable tuning instrumentality, each of said elements causing said oscillator to have an amplitude of oscillation which at an individual preselected frequency established by said each element rises abruptly to a maximum value and then gradually decreases as said tuning instrumentality is adjusted continuously in a given sense over a range of adjustment thereof, power-energizable means for adjusting said tuning instrumentality through each said preselected frequency and in said given sense over said range, and a control system responsive to a predetermined amplitude of oscillation of said oscillator for deenergizing said last-mentioned means to terminate said adjustment of said tuning instrumentality thereby.

4. In automatic tuning apparatus, in combination, an oscillator including a frequency-determining element and a resonant circuit having an adjustable tuning instrumentality, said element causing said oscillator to have an amplitude of oscillation which at a preselected frequency established by said element rises abruptly to a maximum value and then gradually decreases as said tuning instrumentality is adjusted continuously in a given sense over a range of adjustment thereof, power-energizable means for adjusting said tuning instrumentality through said preselected frequency and in said given sense over said range, and a control system responsive to a predetermined amplitude of oscillation developed across said frequency-determining element for deenergizing said last-mentioned means to terminate said adjustment of said tuning instrumentality thereby.

MARION J. PIFER.

REFERENCES CITED

The following references are of record in the file of this patent:

UNITED STATES PATENTS

| Number | Name | Date |
|---|---|---|
| 2,040,645 | Stapleton et al. | June 16, 1936 |
| 2,108,154 | Van Loon | Feb. 15, 1938 |
| 2,382,203 | Chandler | Aug. 14, 1945 |